US009219002B2

(12) United States Patent
Hu et al.

(10) Patent No.: US 9,219,002 B2
(45) Date of Patent: Dec. 22, 2015

(54) OVERLAY PERFORMANCE FOR A FIN FIELD EFFECT TRANSISTOR DEVICE

(71) Applicant: GLOBALFOUNDRIES Inc., Grand Cayman (KY)

(72) Inventors: Zhenyu Hu, Clifton Park, NY (US); Andy Wei, Queensbury, NY (US); Qi Zhang, Mechanicville, NY (US); Richard J. Carter, Saratoga Springs, NY (US); Hongliang Shen, Ballston Lake, NY (US); Daniel Pham, Clifton Park, NY (US); Sruthi Muralidharan, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 46 days.

(21) Appl. No.: 14/028,724

(22) Filed: Sep. 17, 2013

(65) Prior Publication Data

US 2015/0076653 A1    Mar. 19, 2015

(51) Int. Cl.
*H01L 21/336* (2006.01)
*H01L 21/762* (2006.01)
*H01L 21/308* (2006.01)

(52) U.S. Cl.
CPC ...... *H01L 21/76224* (2013.01); *H01L 21/3081* (2013.01)

(58) Field of Classification Search
CPC ............ H01L 29/66795; H01L 29/785; H01L 29/78645; H01L 29/66772; H01L 29/78648
USPC ......................................... 438/283, 284, 424
See application file for complete search history.

(56) References Cited

U.S. PATENT DOCUMENTS

| | | | |
|---|---|---|---|
| 8,501,607 B1 | 8/2013 | Juengling | |
| 2012/0126375 A1 | 5/2012 | Wang et al. | |
| 2012/0146159 A1* | 6/2012 | Wang et al. ................... | 257/410 |
| 2013/0001749 A1 | 1/2013 | Arnold et al. | |
| 2013/0045580 A1 | 2/2013 | Cho | |
| 2013/0049134 A1 | 2/2013 | Sunamura | |

* cited by examiner

*Primary Examiner* — Quoc Hoang
(74) *Attorney, Agent, or Firm* — Williams Morgan, P.C.

(57) ABSTRACT

Approaches for improving overlay performance for an integrated circuit (IC) device are provided. Specifically, the IC device (e.g., a fin field effect transistor (FinFET)) is provided with an oxide layer and a pad layer formed over a substrate, wherein the oxide layer comprises an alignment and overlay mark, an oxide deposited in a set of openings formed through the pad layer and into the substrate, a mandrel layer deposited over the oxide material and the pad layer, and a set of fins patterned in the IC device without etching the alignment and overlay mark. With this approach, the alignment and overlay mark is provided with the fin cut (FC) layer and, therefore, avoids finification.

14 Claims, 7 Drawing Sheets

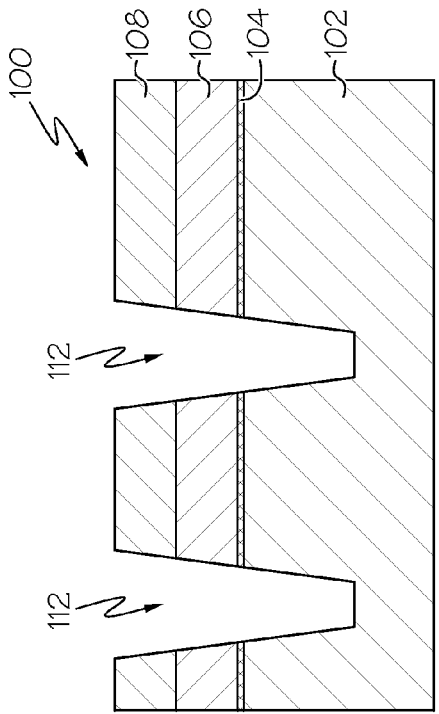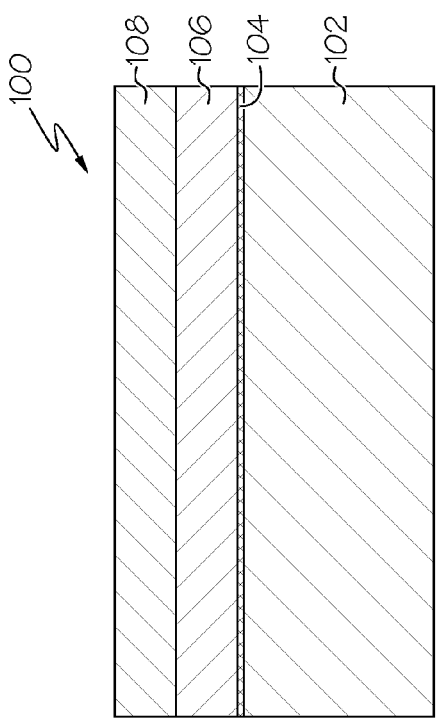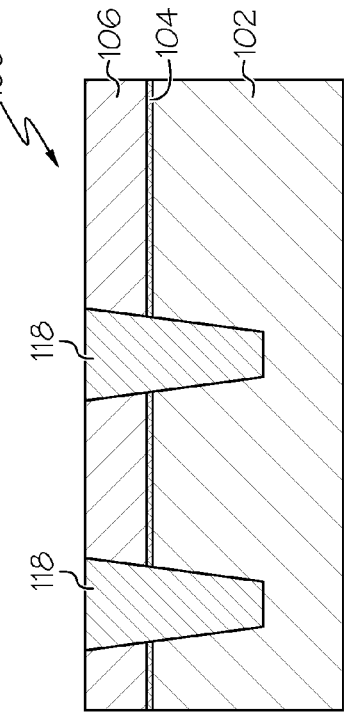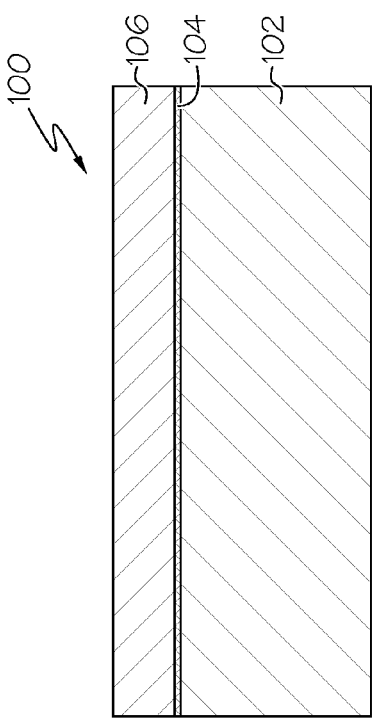

OVERLAY PERFORMANCE FOR A FIN FIELD EFFECT TRANSISTOR DEVICE

BACKGROUND

1. Technical Field

This invention relates generally to the field of semiconductors, and more particularly, to improving alignment/overlay performance for a fin field effect transistor device.

2. Related Art

A typical integrated circuit (IC) chip includes a stack of several levels or sequentially formed layers of shapes. Each layer is stacked or overlaid on a prior layer and patterned to form the shapes that define devices (e.g., fin field effect transistors (FinFETs)) and connect the devices into circuits. In a typical state of the art complementary insulated gate FinFET process, such as what is normally referred to as CMOS, layers are formed on a wafer to form the devices on a surface of the wafer. Further, the surface may be the surface of a silicon layer on a silicon on insulator (SOI) wafer. A simple FinFET includes a gate layer rectangle on a silicon island formed from the silicon surface layer. Each of these layers of shapes, also known as mask levels or layers, may be created or printed optically through well known photolithographic masking, developing and level definition, e.g., etching, implanting, deposition, etc.

Overlay performance is a known critical factor for advanced semiconductor manufacturing of 3-D FinFETs. Over time, these overlay performance requirements have become more stringent as design rules shrink. Overlay mark design and selection are the first two steps of overlay control, and it is known that different overlay mark designs will have different responses to process conditions. An overlay mark optimized for traditional process might not be suitable in some fin-based alignment mask concepts due to changes in lithography and etching process conditions. For example, as shown in FIG. 1(a)-(b), an alignment and overlay mark 10 of a prior art device 12 receives finification due to the mandrel overlay and etch process. In this case, image quality is poor for mark 10 because the fin profile, line end shortness, and line edge roughness for the fin greatly impact overlay measurement quality.

SUMMARY

In general, approaches for improving overlay performance for an integrated circuit (IC) device (e.g., fin field effect transistors (FinFETs)) are provided. Specifically, the IC device is provided with an oxide layer and a pad layer formed over a substrate, wherein the oxide layer comprises an alignment/overlay mark, a fin cut (FC) mask formed over the pad layer, an oxide deposited in a set of openings formed through the pad layer and into the substrate, and a mandrel layer deposited over the oxide material and the pad layer. The IC device further comprises a set of fins patterned therein, following deposition of the mandrel layer. With this approach, the alignment and overlay mark is provided with the fin cut (FC) layer and, therefore, avoids finification.

One aspect of the present invention includes a method for forming a device, the method comprising: forming an oxide layer and a pad layer over a substrate, the oxide layer comprising an alignment and overlay mark; forming a fin cut (FC) mask over the pad layer; forming a set of openings through the pad layer and into the substrate; depositing an oxide in each of the set of openings; depositing a mandrel layer over the oxide material and the pad layer; and patterning a set of fins in the device without etching the alignment and overlay mark.

Another aspect of the present invention includes a method for forming an integrated circuit (IC) device, the method comprising: forming an oxide layer and a pad layer over a substrate, the oxide layer comprising an alignment and overlay mark; forming a fin cut (FC) mask over the pad layer; forming a set of openings through the pad layer and into the substrate; depositing an oxide in each of the set of openings; depositing a mandrel layer over the oxide material and the pad layer; and patterning a set of fins in the IC device without etching the alignment and overlay mark.

Yet another aspect of the present invention includes integrated circuit (IC) device comprising: an oxide layer and a pad layer formed over a substrate, the oxide layer including an overlay and alignment mark formed therein; a fin cut (FC) mask formed over the pad layer; an oxide deposited in a set of openings formed through the pad layer and into the substrate; a mandrel layer deposited over the oxide material and the pad layer; and a set of fins patterned in the device, wherein the set of fins is patterned without etching the alignment and overlay mark.

BRIEF DESCRIPTION OF THE DRAWINGS

These and other features of this invention will be more readily understood from the following detailed description of the various aspects of the invention taken in conjunction with the accompanying drawings in which:

FIG. 4(a) shows a cross-sectional view, along the first direction, of a further etching of the set of openings according to illustrative embodiments;

FIG. 4(b) shows a cross-sectional view, along the second direction, of the further etching of the set of openings according to illustrative embodiments;

FIG. 5(a) shows a cross-sectional view, along the first direction, of oxide formation within the set of openings according to illustrative embodiments;

FIG. 5(b) shows a cross-sectional view, along the second direction, of oxide formation within the set of openings according to illustrative embodiments;

Figure 1B:
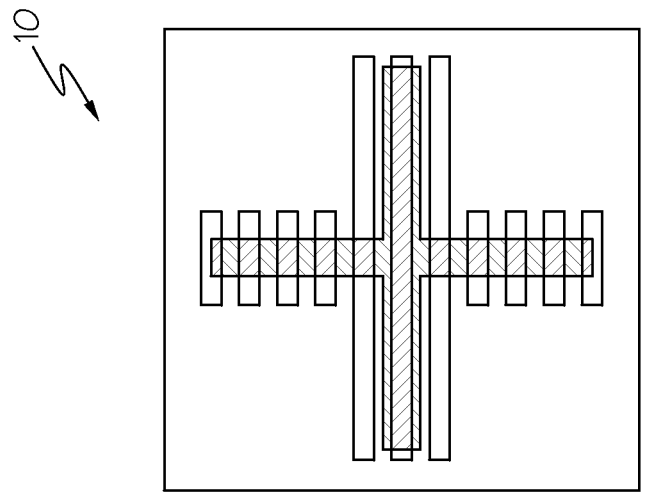
FIGS. 1(a)-1(b) show a top view of prior art alignment and overlay marks.
Figure 1A:
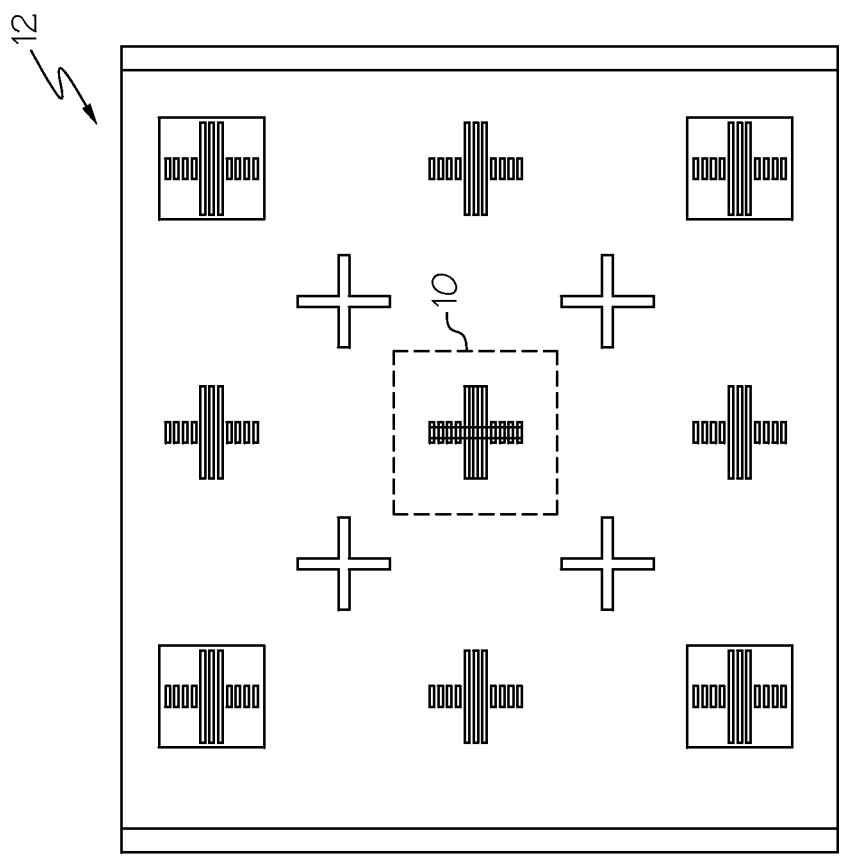

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Also, for clarity, some reference numbers may be omitted in certain drawings.

DETAILED DESCRIPTION

Exemplary embodiments will now be described more fully herein with reference to the accompanying drawings, in which exemplary embodiments are shown. Described are approaches for improving overlay performance for an integrated circuit (IC) device. Specifically, the IC device (e.g., a FinFET device) is provided with an oxide layer and a pad layer formed over a substrate, wherein the oxide layer includes an alignment and overlay mark, a fin cut (FC) mask formed over the pad layer, an oxide deposited in a set of openings formed through the pad layer and into the substrate, and a mandrel layer deposited over the oxide material and the pad layer. The IC device further comprises a set of fins patterned therein, following deposition of the mandrel layer. With this approach, the alignment and overlay mark is provided with the FC layer to avoid finification.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-improved CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2A:
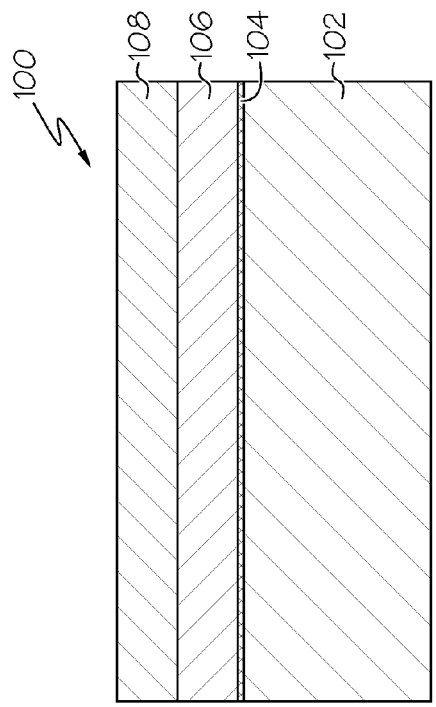
FIG. 2(a) shows a cross-sectional view, along a first direction, of formation of a fin cut mask containing an alignment and overlay mark according to illustrative embodiments.
Figure 2B:
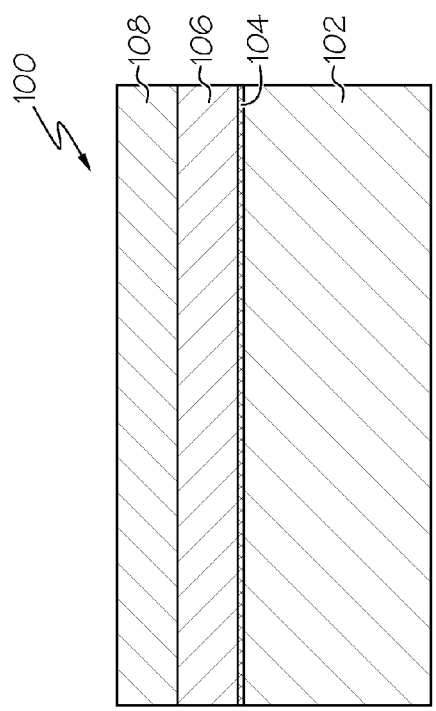
FIG. 2(b) shows a cross-sectional view, along a second direction that is perpendicular to the first direction shown in FIG. 2(a), of formation of the fin cut mask containing the alignment and overlay mark according to illustrative embodiments.

With reference again to the figures, FIG. 2(a) shows a cross sectional view, along a first direction (e.g., 'x' direction), of a device 100 according to an embodiment of the invention, and FIG. 2(b) shows a cross sectional view, along a second direction (e.g., 'y' direction) perpendicular to the first direction, of device 100. Device 100 comprises a substrate 102, an oxide layer 104 formed over substrate 102, a pad layer 106 (e.g., nitride) formed over oxide layer 104, and a fin cut (FC) mask 108 formed over pad layer 106. In one embodiment, oxide layer 104 and pad layer 106 combine to form a hard mask, wherein pad layer 106 comprises SiN, and oxide layer 104 comprises SiO2. Pad layer 106 may be composed of nitride formed utilizing a conventional deposition process such as CVD or plasma-assisted CVD. The material of pad layer 106 is selected such that pad layer 106 functions as a hardmask and as a polish stop layer during subsequent fabrication stages. The material forming pad layer 106 must also etch selectively to the material constituting the SOI layer. The vertical thickness of pad layer 106 may be about 10 nm to about 1000 nm.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

As understood, the term "alignment" is used herein to refer to the process of assuring reticle-to-wafer registration when the wafer is in the exposure tool. The term "overlay" refers to after-exposure (or post-development) measure of how accurately the process was carried out. In various embodiments of the invention, a rectangular alignment mark is provided within oxide layer 104 and is used during the process of assuring reticle-to-wafer registration when the wafer is in the exposure tool. In one embodiment, the dimension of the alignment and overlay mark is about 40 μm×40 μm, and may be shrunk to about 10 μm×10 μm or even smaller depending on the design requirements and the detection means employed. The alignment and overlay mark may comprise a plurality of sets of slits (or bars), but it will be appreciated that many alternative shapes and patterns are possible.

Figure 3A:
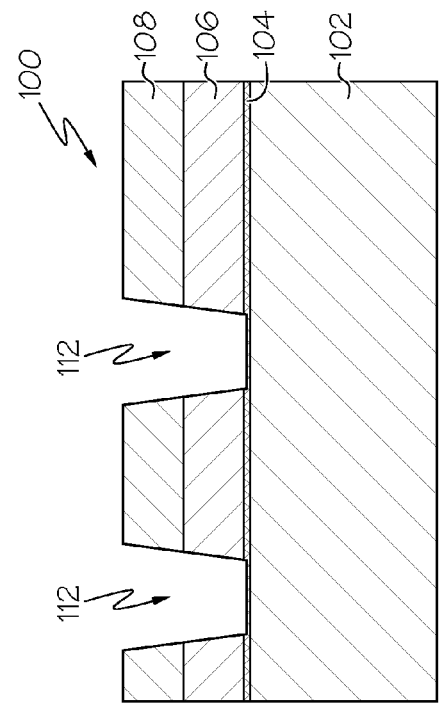
FIG. 3(a) shows a cross-sectional view, along the first direction, of formation of a set of openings according to illustrative embodiments.
Figure 3B:
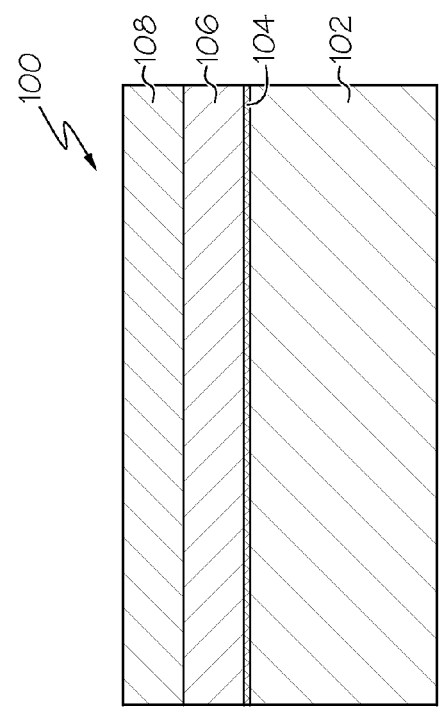
FIG. 3(b) shows a cross-sectional view, along the second direction, of formation of the set of openings according to illustrative embodiments.

Next, as shown in FIGS. 3(a)-3(b), a set of openings 112 are formed through FC mask 108 and pad layer 106 selective to oxide layer 104. In this embodiment, openings 112 are patterned, for example, using a photo-lithography processes or other lithographic process (e.g., electron beam lithography, imprint lithography, etc.), and removed by a suitable etching process including a wet etch, dry etch, plasma etch, and the like.

Openings 112 are then extended down through oxide layer 104, and into substrate 102, as shown in FIGS. 4(a)-4(b), and an oxide 118 is deposited over device 100 and within openings 112, as shown in FIGS. 5(a)-5(b). In this embodiment, oxide 118 is deposited atop all of device 100, and then removed, e.g., via chemical mechanical planarization (CMP). Oxide 118 may be formed using a high aspect ratio process such as, PVD, CVD, PECVD, APCVD, LPCVD, HD CVD, ALCVD, and/or other suitable processes.

Figure 6A:
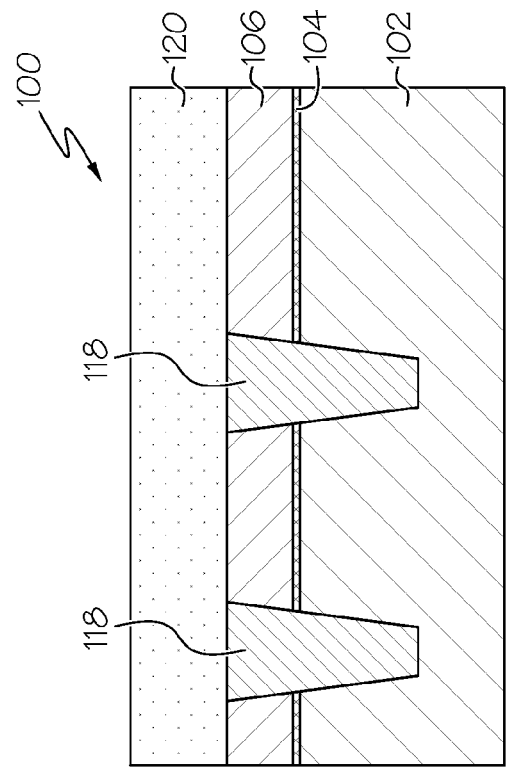
FIG. 6(a) shows a cross-sectional view, along the first direction, of formation of a mandrel layer according to illustrative embodiments.
Figure 6B:
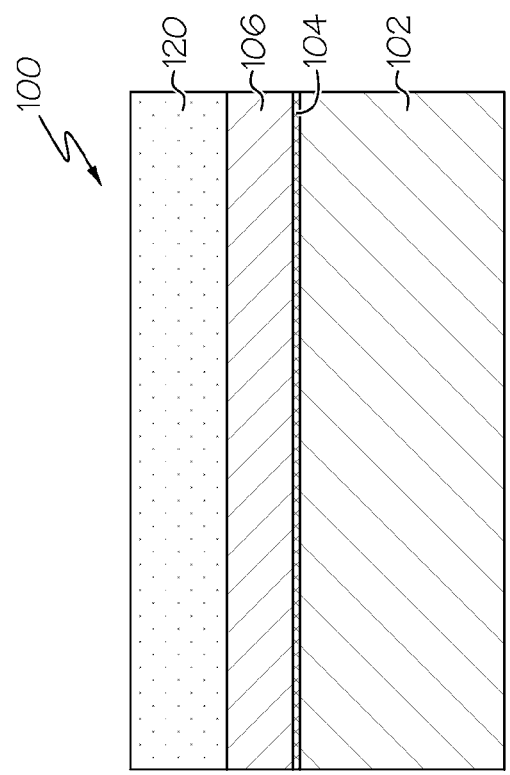
FIG. 6(b) shows a cross-sectional view, along the second direction, of formation of a mandrel layer according to illustrative embodiments.

Next, as shown in FIGS. 6(a)-6(b), a mandrel layer 120 is formed atop device 100, including atop pad layer 106 and oxide 118. In various embodiments, mandrel layer 120 may comprise an inorganic and/or dielectric material such as polycrystalline silicon or silicon oxide ($SiO_x$) where x is a number greater than zero, silicon nitride ($Si_3N_4$), silicon oxynitride (SiON), or the like.

Figure 7:
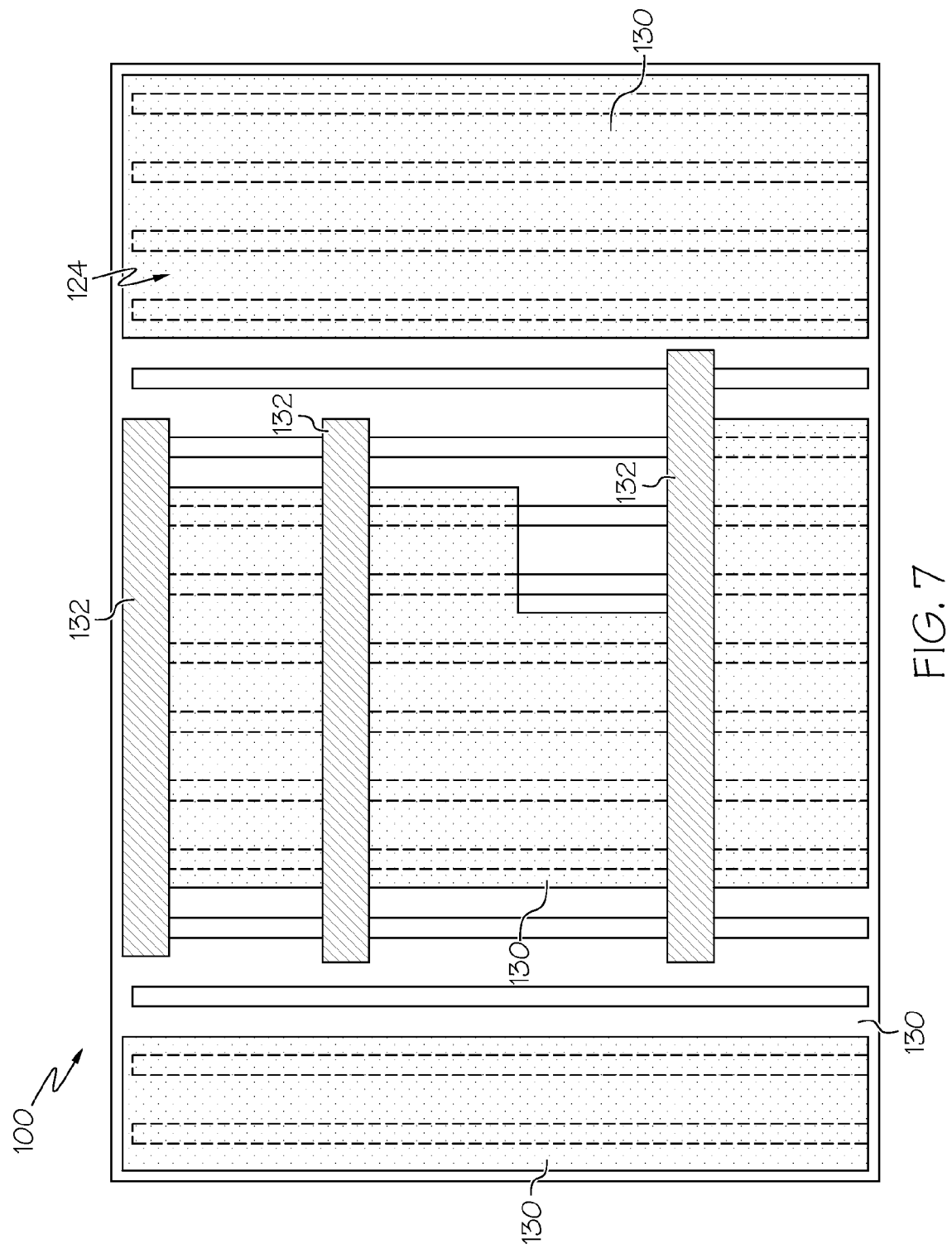
FIG. 7 shows a top view of an IC device (e.g., a fin field effect transistor (FinFET)) according to illustrative embodiments.
Figure 8A:
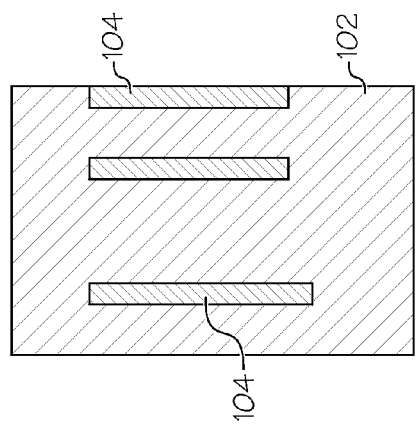
FIG. 8(a) shows a top view of a circuit area of the FinFET device according to illustrative embodiments.
Figure 8B:
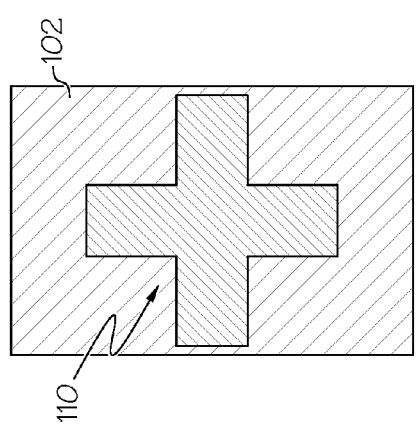
FIG. 8(b) shows a top view of the overlay and alignment mark corresponding to the circuit area of FIG. 8(a) according to illustrative embodiments.
Figure 9A:
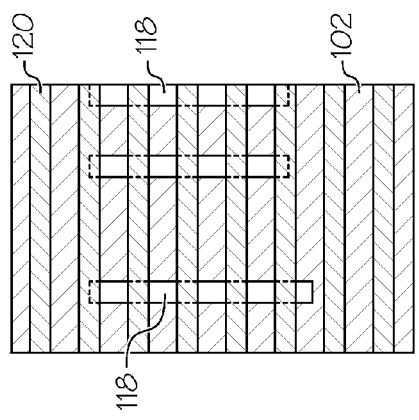
FIG. 9(a) shows a top view of a circuit area of the FinFET device according to illustrative embodiments.
Figure 9B:
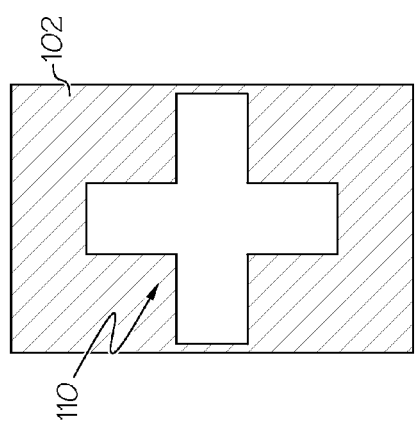
FIG. 9(b) shows a top view of the overlay and alignment mark corresponding to the circuit area of FIG. 9(a) according to illustrative embodiments.
Figure 10A:
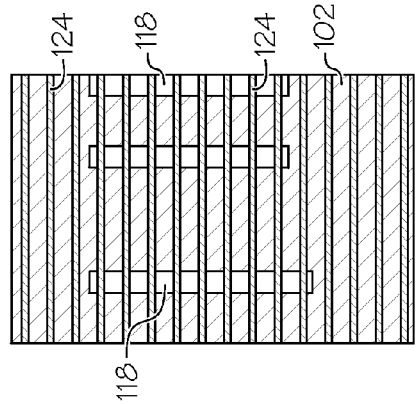
FIG. 10(a) shows a top view of a circuit area of the FinFET device according to illustrative embodiments.
Figure 10B:
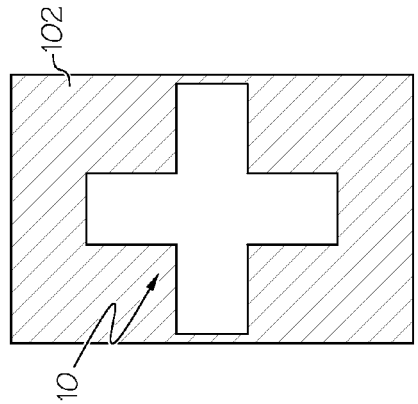
FIG. 10(b) shows a top view of the overlay and alignment mark corresponding to the circuit area of FIG. 10(a) according to illustrative embodiments.
Figure 12A:
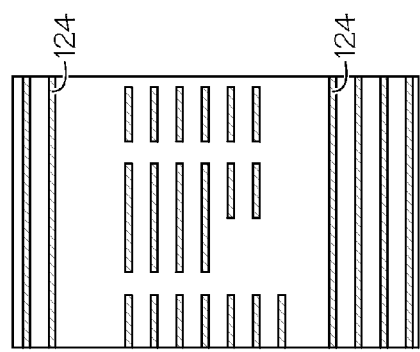
FIG. 12(a) shows a top view of a circuit area of the FinFET device according to illustrative embodiments.
Figure 12B:
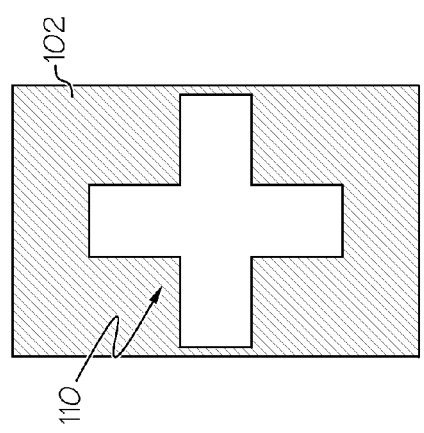
FIG. 12(b) shows a top view of the overlay and alignment mark corresponding to the circuit area of FIG. 12(a) according to illustrative embodiments.
Figure 11A:
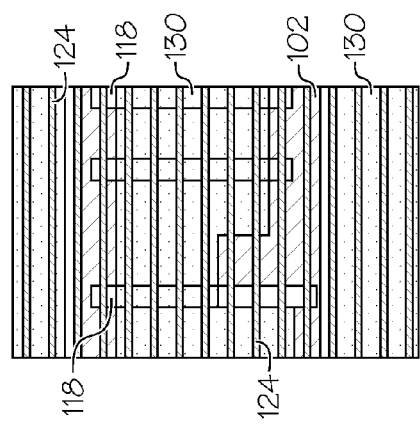
FIG. 11(a) shows a top view of a circuit area of the FinFET device according to illustrative embodiments.
Figure 11B:
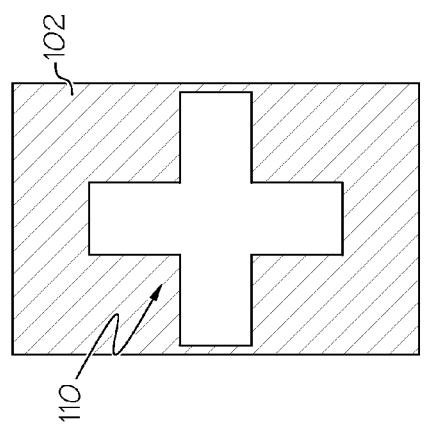
FIG. 11(b) shows a top view of the overlay and alignment mark corresponding to the circuit area of FIG. 11(a) according to illustrative embodiments.

Following deposition of mandrel layer 120, a plurality of fins 124 are formed within device 100, as shown in FIG. 7, along with a plurality of fin preserve (FP) patterns 130 formed over fins 124. It will be appreciated that the number of fins 124 and the size and positioning of the FP 130 are all for illustrative purposes only. Also shown are fin cut (FC) layers 132 formed over fins 124, wherein the position and the size of FC layers 132 are only for illustrative purposes. Other positions and sizes of FC layers 132 are possible.

Referring now to FIGS. 8-12, top views of a process for forming fins 124 without finification of the alignment/overlay mark will be described in greater detail. It will be appreciated that each of FIGS. 8(a), 9(a), 10(a), 11(a), and 12(a) show various processing steps at the circuit level, while each of FIGS. 8(b), 9(b), 10(b), 11(b), and 12(b) show an alignment/overlay mark at each corresponding step. As shown first in FIG. 8(a), which is a top view of FIGS. 3(a)-3(b), a set of openings 112 (FIG. 3(b)) is formed in the device to expose oxide 104. In this exemplary embodiment, fin cut patterning is performed first, and alignment/overlay mark 110 is printed, as shown in FIG. 8(b). Set of openings 112 (FIG. 4(b)) is then extended down into substrate 102, oxide 118 is formed therein, and mandrel layer 120 is patterned over top, as shown in FIG. 9(a). Corresponding alignment/overlay mark 110 of FIG. 9(b) shows a large mark during fin mandrel processing. Next, as shown in FIG. 10(a), set of fins 124 is formed (e.g., from a sidewall image transfer process) from the device without finification (i.e., etching) to alignment/overlay mark 110, as shown in FIG. 10(b). Next, fin preserve pattern 130 is formed over fins 124 (resulting in no change to alignment/overlay mark 110 of FIG. 11(b)), followed by a fin etch process to fins 124, as shown in FIG. 12(a). FIG. 12(b) demonstrates big overlay/alignment mark 110 for the post cut layer, which provides better image quality.

In various embodiments, design tools can be provided and configured to create the datasets used to pattern the semiconductor layers as described herein. For example, design tools can be used to form an oxide layer and a pad layer over a substrate, the oxide layer comprising an alignment and overlay mark; form a FC mask over the pad layer; form a set of openings through the pad layer and into the substrate; deposit an oxide in each of the set of openings; deposit a mandrel layer over the pad layer and the oxide; and pattern a set of fins in the device without etching the alignment and overlay mark. To accomplish this, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that approaches have been described for improving overlay performance for an IC device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
    forming an oxide layer and a pad layer over a substrate, the oxide layer comprising an alignment and overlay mark;
    forming a fin cut (FC) mask over the pad layer;
    forming a set of openings through the pad layer and into the substrate;
    depositing an oxide in each of the set of openings;
    depositing a mandrel layer over the oxide material and the pad layer; and
    patterning a set of fins in the device without etching the alignment and overlay mark.

2. The method according to claim 1, further comprising planarizing the oxide material selective to the pad layer.

3. The method according to claim 1, the patterning the set of fins in the device comprising etching the substrate.

4. The method according to claim 1, further comprising forming a fin preserve layer over the set of fins.

5. The method according to claim 1, further comprising patterning the FC mask to form the set of openings.

6. The method according to claim 1, wherein the device is a fin field effect transistor.

7. The method according to claim 1, wherein the mandrel layer comprises an oxide material.

8. A method for improving overlay performance for an integrated circuit (IC) device, the method comprising:
    forming an oxide layer and a pad layer over a substrate, the oxide layer comprising an alignment and overlay mark;
    forming a fin cut (FC) mask over the pad layer;
    forming a set of openings through the pad layer and into the substrate;
    depositing an oxide in each of the set of openings;
    depositing a mandrel layer over the oxide material and the pad layer; and
    patterning a set of fins in the IC device without etching the alignment and overlay mark.

9. The method according to claim 8, further comprising planarizing the oxide material selective to the pad layer.

10. The method according to claim 8, the patterning the set of fins in the IC device comprising etching the substrate.

11. The method according to claim 8, further comprising forming a fin preserve over the set of fins.

12. The method according to claim 8, further comprising patterning the FC mask to form the set of openings.

13. The method according to claim 8, wherein the IC device is a fin field effect transistor.

14. The method according to claim 8, wherein the mandrel layer comprises an oxide material.

* * * * *